(12) United States Patent
Kuo et al.

(10) Patent No.: US 10,283,497 B2
(45) Date of Patent: May 7, 2019

(54) LIGHT-EMITTING DIODE CHIP

(71) Applicant: Lextar Electronics Corporation, Hsinchu (TW)

(72) Inventors: Shiou-Yi Kuo, Kaohsiung (TW); Chao-Hsien Lin, New Taipei (TW); Ya-Ru Yang, Hsinchu (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 250 days.

(21) Appl. No.: 15/361,475

(22) Filed: Nov. 27, 2016

(65) Prior Publication Data
US 2017/0194313 A1 Jul. 6, 2017

(30) Foreign Application Priority Data
Dec. 30, 2015 (TW) .............................. 104144505 A

(51) Int. Cl.
| | | |
|---|---|---|
| H01L 33/00 | (2010.01) | |
| H01L 27/02 | (2006.01) | |
| H01L 29/866 | (2006.01) | |
| H01L 29/872 | (2006.01) | |
| H01L 33/52 | (2010.01) | |
| H01L 33/62 | (2010.01) | |
| H01L 27/15 | (2006.01) | |
| H01L 33/38 | (2010.01) | |
| H01L 25/16 | (2006.01) | |

(52) U.S. Cl.
CPC .......... *H01L 27/0255* (2013.01); *H01L 27/15* (2013.01); *H01L 29/866* (2013.01); *H01L 29/872* (2013.01); *H01L 33/52* (2013.01); *H01L 33/62* (2013.01); *H01L 25/167* (2013.01); *H01L 33/382* (2013.01)

(58) Field of Classification Search
CPC ..... H01L 27/15; H01L 29/866; H01L 29/872; H01L 33/52; H01L 33/62; H01L 23/62; H01L 33/06; H01L 33/60; H01L 25/167; H01L 27/0255; H01L 33/382
USPC .......................................................... 257/99
See application file for complete search history.

(56) References Cited

U.S. PATENT DOCUMENTS

| | | |
|---|---|---|
| 2005/0179042 A1 | 8/2005 | Yang et al. |
| 2007/0069218 A1 | 3/2007 | Chen et al. |
| 2010/0019264 A1 | 1/2010 | Jeong |
| 2013/0062638 A1 | 3/2013 | Onushkin et al. |
| 2014/0231832 A1* | 8/2014 | Lee .......................... H01L 27/15 257/88 |
| 2015/0091041 A1 | 4/2015 | Yoon et al. |
| 2015/0349232 A1 | 12/2015 | Lee et al. |

FOREIGN PATENT DOCUMENTS

| | | |
|---|---|---|
| CN | 202871793 U | 4/2013 |
| JP | 2006-86489 A | 3/2006 |
| JP | 2012-23328 A | 2/2012 |
| TW | 492202 B | 6/2002 |
| TW | I229463 B | 3/2005 |
| TW | I414082 B | 11/2013 |

* cited by examiner

*Primary Examiner* — Kimberly N Rizkallah
*Assistant Examiner* — Dilinh P Nguyen
(74) *Attorney, Agent, or Firm* — CKC & Partners Co., LLC

(57) ABSTRACT

The present invention provides a light-emitting diode (LED) chip. The LED chip includes a LED structure and an electrostatic discharge (ESD) protection structure. The ESD protection structure is in a corner of the LED chip and connects with the LED structure in anti-parallel. An interface between the LED structure and the ESD protection structure is a straight line from a top view.

7 Claims, 4 Drawing Sheets

LIGHT-EMITTING DIODE CHIP

RELATED APPLICATIONS

This application claims priority to Taiwanese Application Serial Number 104144505, filed Dec. 30, 2015, which is herein incorporated by reference.

BACKGROUND

Field of Invention

The present invention relates to a semiconductor component. More particularly, the present invention relates to a light-emitting diode chip.

Description of Related Art

During processes of fabricating, assembling and examining light-emitting diode chips, electrostatic charges often accumulate within the light-emitting diode chips. As the electrostatic charges accumulate to a certain extent, an electrostatic discharge would occur. Due to the high voltage, short discharge time, and large instant current of the electrostatic discharge, it would cause damage to the circuit function of the light-emitting diode chips.

For preventing the damage caused by the electrostatic discharge, electrostatic discharge (ESD) protection structures are often disposed in the light-emitting diode chips; however, the electrostatic discharge protection structures would lead to a reduction in the light-emitting area of the light-emitting diode chips, and degrade the yield and the quantity of light-emitting diode chips at the same time. As a result, new light-emitting diode chips are required.

SUMMARY

The invention provides a light-emitting diode chip. The light-emitting diode chip includes a light-emitting diode structure and an electrostatic discharge (ESD) protection structure. The electrostatic discharge protection structure is in a corner of the light-emitting diode chip and connects with the light-emitting diode structure in anti-parallel. An interface between the light-emitting diode structure and the electrostatic discharge protection structure is a straight line from a top view.

In one embodiment of the invention, a top-view outline of the electrostatic discharge protection structure is triangular.

In one embodiment of the invention, a top-view area of the electrostatic discharge protection structure is 0.5-30% of a top-view area of the light-emitting diode structure.

In one embodiment of the invention, the light-emitting diode structure includes a first semiconductor layer, a first active layer, and a second semiconductor layer. The first semiconductor layer has a first type doping. The first active layer is disposed on the partial first semiconductor layer. The second semiconductor layer disposed on the first active layer is next to the interface and has a second type doping different from the first type doping.

In one embodiment of the invention, the electrostatic discharge protection structure includes a third semiconductor layer, a second active layer, and a fourth semiconductor layer. The third semiconductor layer has the first type doping. The second active layer is disposed on the partial third semiconductor layer. The fourth semiconductor layer disposed on the second active layer is next to the interface and has the second type doping.

In one embodiment of the invention, the first type doping is n-type doping and the second type doping is p-type doping.

In one embodiment of the invention, the interface includes a connection region. The connection region includes a first protective layer, a first wire, a second protective layer, and a second wire. The first protective layer insulates the light-emitting diode structure from the electrostatic discharge protection structure. The first wire covers the first protective layer, extends onto the first semiconductor layer and the fourth semiconductor layer, and electrically connects the first semiconductor layer with the fourth semiconductor layer. The second protective layer is disposed on the first wire. The second wire is disposed on the second protective layer, extends onto the second semiconductor layer and the third semiconductor layer, and electrically connects the second semiconductor layer with the third semiconductor layer.

In one embodiment of the invention, the first wire partially covers the first protective layer.

In one embodiment of the invention, the light-emitting diode chip further includes a first barrier layer between the second wire and the second semiconductor layer; and a second barrier layer between the second wire and the fourth semiconductor layer.

In one embodiment of the invention, the electrostatic discharge protection structure comprises a Zener diode or a Schottky diode.

BRIEF DESCRIPTION OF THE DRAWINGS

The invention can be more fully understood by reading the following detailed description of the embodiment, with reference made to the accompanying drawings as follows.

DETAILED DESCRIPTION

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1B:
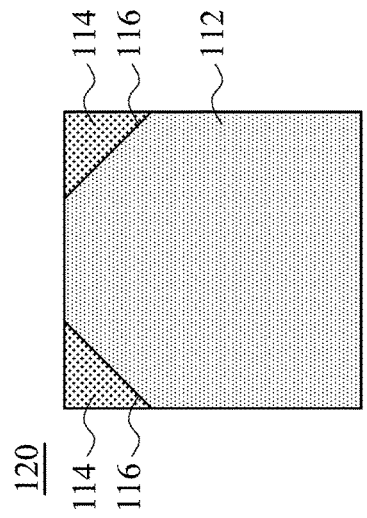
FIGS. 1A-1D are top-view diagrams of light-emitting diode chips according to one embodiment of this invention.
Figure 1D:
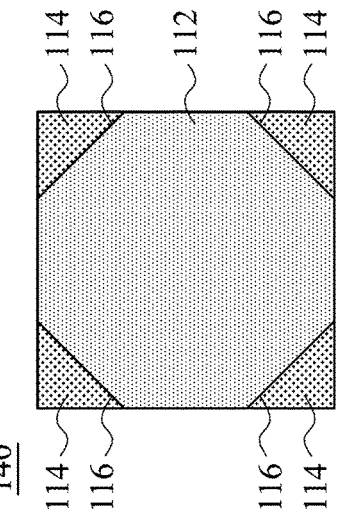
Figure 1A:
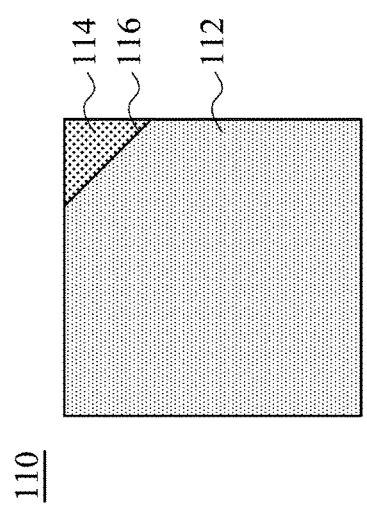

Please refer to FIGS. 1A-1D. FIGS. 1A-1D are top-view diagrams of light-emitting diode chips according to one embodiment of this invention. As shown in FIG. 1A, a light-emitting diode chip 110 includes a light-emitting diode structure 112 and an electrostatic discharge protection (ESD) structure 114, which is used to avoid damages caused by electrostatic discharge. The electrostatic discharge protection structure 114 is disposed in a corner of the light-emitting diode chip 110 and connects with the light-emitting diode structure 112 in anti-parallel. An interface 116 between the light-emitting diode structure 112 and the electrostatic discharge protection structure 114 is a straight line from a top view. It is worth noting that because the light-emitting diode structure 112 and the electrostatic discharge protection structure 114 are connected in anti-parallel, current could flow out from the electrostatic discharge protection structure 114 without causing damages to the light-emitting diode structure 112 as encountering the electrostatic discharge.

In one embodiment of the invention, the electrostatic discharge protection structure includes a Zener diode or a Schottky diode.

Through many kinds of electrically connecting components, the light-emitting diode structure 112 could connect with the electrostatic discharge protection structure 114 in anti-parallel. For example, electrically connecting components include wire bondings, bonding pads, or conducting materials disposed in the interface 116. Therefore, depending on the different design requirements, insulating materials can be disposed in the interface 116 for insulating the light-emitting diode structure 112 from the electrostatic discharge protection structure 114. Unnecessary details are not provided here.

As shown in FIG. 1A, it is worth noting that the interface 116 between the light-emitting diode structure 112 and the electrostatic discharge protection structure 114 is a straight line from a top view, namely, the interface 116 is not circuitous from a top view. Compared with circuitous or zigzag interfaces, the interface 116 could reduce the possibility of occurring leakage current, further enhancing the quantity, yield and electrical performance of the light-emitting diode chip. Besides, owing to an insulating requirement between the light-emitting diode structure 112 and the electrostatic discharge protection structure 114, there must exist some interfaces, of which the simplest form is a straight line. Accordingly, the straight-line design of the interface 116 would minimize contact area between the light-emitting diode structure 112 and the electrostatic discharge protection structure 114, further abating problems of the interface blocking the emergent light and enhancing the luminous efficacy of the light-emitting diode chip accordingly.

Figure 1C:
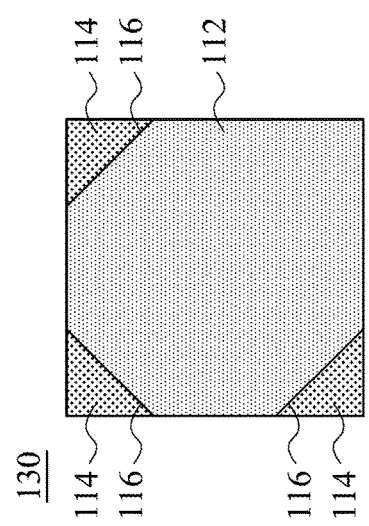

In one embodiment of the invention, a light-emitting diode chip may includes a plurality of electrostatic discharge protection structures. Depending on the different design requirements, the numbers and positions of the electrostatic discharge protection structures are freely adjustable. As shown in FIG. 1B, a light-emitting diode chip 120 includes two electrostatic discharge protection structures 114. As shown in FIG. 1C, a light-emitting diode chip 130 includes three electrostatic discharge protection structures 114. As shown in FIG. 1D, a light-emitting diode chip 140 includes four electrostatic discharge protection structures 114.

The present invention illustratively shows the light-emitting diode chip 110, the light-emitting diode chip 120, the light-emitting diode chip 130 and the light-emitting diode chip 140 are rectangular. Furthermore, in one embodiment of the invention, a top-view outline of the electrostatic discharge protection structure 114 is triangular. Compared with rectangular electrostatic discharge protection structures, a top-view area of the electrostatic discharge protection structure 114 is smaller, such that a top-view area of the light-emitting diode structure 112 increases and the light-emitting area of the light-emitting diode structure 112 is larger accordingly. However, the shape of the light-emitting diode chip is arbitrary and is not limited to the illustrative figures in the invention.

In one embodiment of the invention, a top-view area of an electrostatic discharge protection structure is 0.5-30% of a top-view area of a light-emitting diode structure.

Figure 2:
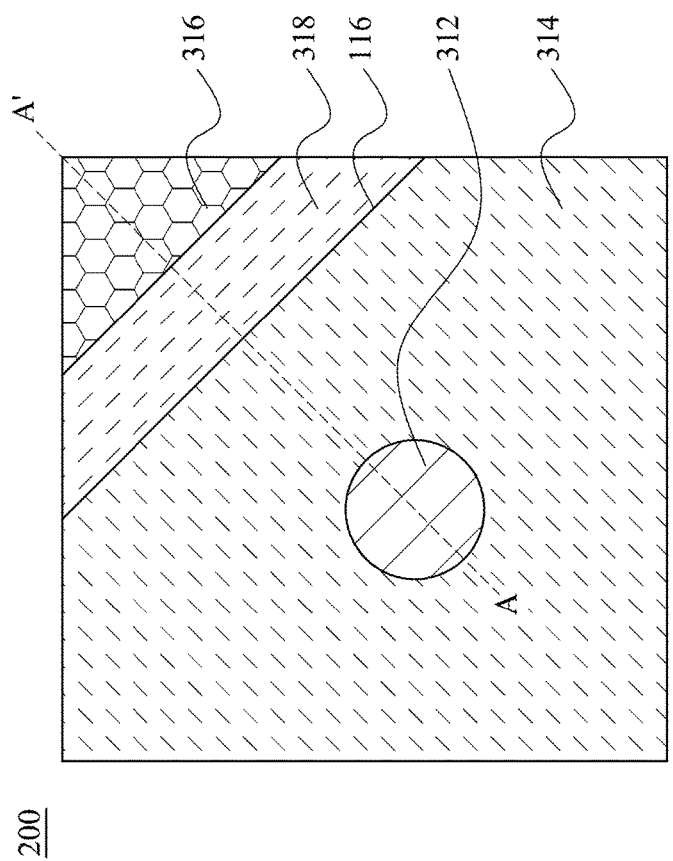
FIG. 2 is a top-view diagram of a light-emitting diode chip according to one embodiment of this invention.

Please refer to FIG. 2. FIG. 2 is a top-view diagram of a light-emitting diode chip according to one embodiment of this invention. As shown in FIG. 2, a light-emitting diode chip 200 includes a first semiconductor layer 312, a second semiconductor layer 314, a third semiconductor layer 316 and a fourth semiconductor layer 318. The interface 116 between the second semiconductor layer 314 and the fourth semiconductor layer 318 is a straight line from the top view. The second semiconductor layer 314 and the fourth semiconductor layer 318 are next to the interface 116.

The first semiconductor layer 312 and the second semiconductor layer 314 are components of the light-emitting diode structure. The third semiconductor layer 316 and the fourth semiconductor layer 318 are components of the electrostatic discharge protection structure. Other components of the light-emitting diode chip 200 are not shown here for clarity. The second semiconductor layer 314 is disposed on the first semiconductor layer 312 and the partial first semiconductor layer 312 is exposed. The fourth semiconductor layer 318 is disposed on the third semiconductor layer 316 and the partial third semiconductor layer 316 is exposed. In one embodiment of the invention, a top-view area of the fourth semiconductor layer 318 is larger than 3000 μm$^2$.

In one embodiment of the invention, the first semiconductor layer 312 has a first type doping. On the other hand, the second semiconductor layer 314 has a second type doping which is different from the first type doping. In one embodiment of the invention, the third semiconductor layer 316 has a first type doping. On the other hand, the fourth semiconductor layer 318 has a second type doping which is different from the first type doping.

In one embodiment of the invention, the first type doping is n-type doping and the second type doping is p-type doping. In another embodiment of the invention, the first type doping is p-type doping and the second type doping is n-type doping. For instance, both the first semiconductor layer 312 and the third semiconductor layer 316 are n-type germanium nitride (GaN). On the other hand, both the second semiconductor layer 314 and the fourth semiconductor layer 318 are p-type GaN.

Figure 3:
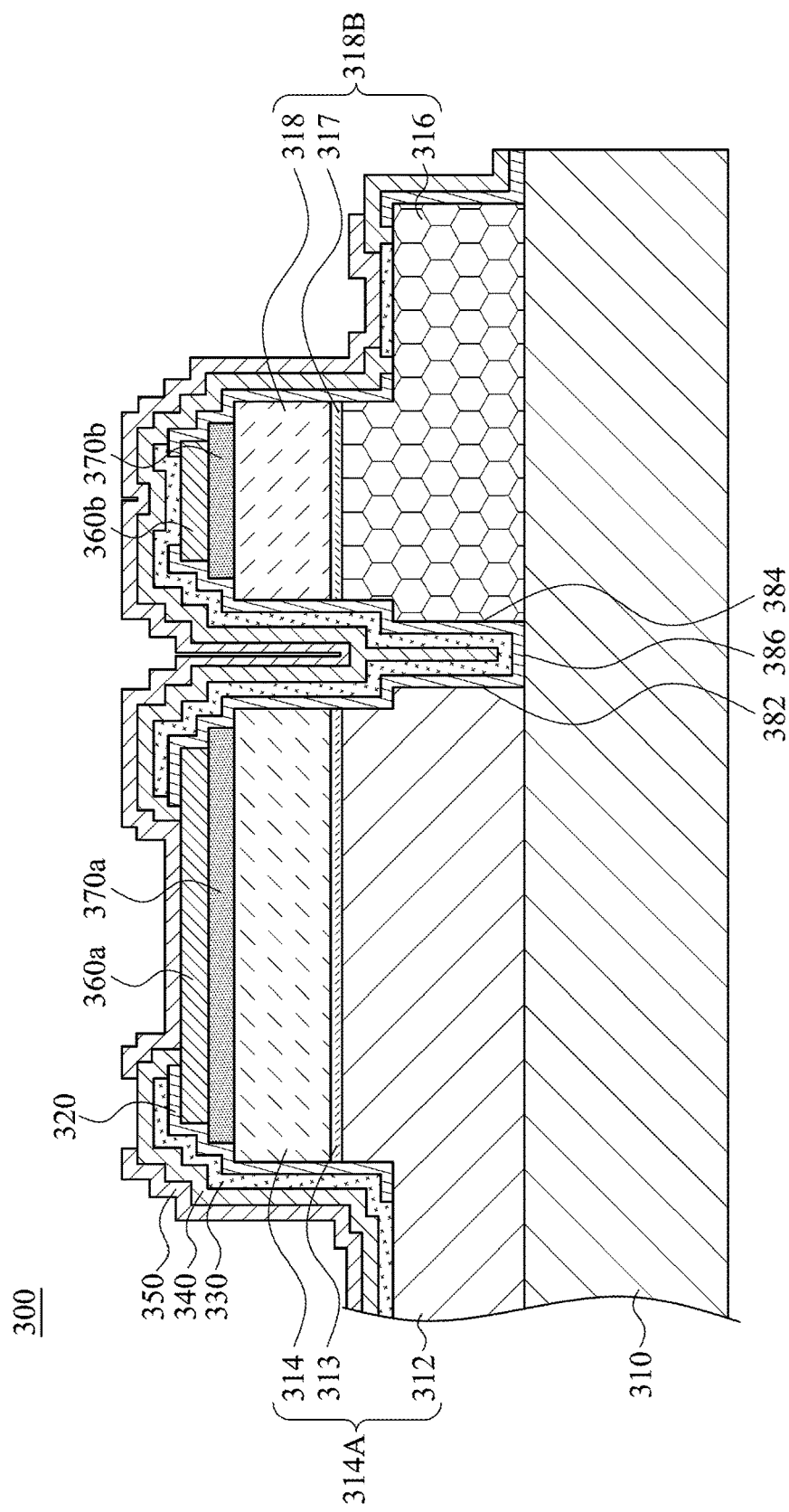
FIG. 3 is a cross-sectional diagram of the light-emitting diode chip along the section line A-A' in FIG. 2.

Please refer to FIG. 3. FIG. 3 is a cross-sectional diagram of the light-emitting diode chip along the section line A-A' in FIG. 2. The light-emitting diode chip 300 in FIG. 3 shows these components which are not shown in light-emitting diode chip 200. As shown in FIG. 3, a light-emitting diode structure 314A and an electrostatic discharge protection structure 318B are disposed on a substrate 310. The substrate 310 could be, for example, a sapphire substrate. The light-emitting diode structure 314A includes the first semiconductor layer 312, a first active layer 313 disposed on the partial first semiconductor layer 312, and the second semiconductor layer 314 disposed on the first active layer 313. As electron-hole recombination occur at the first active layer 313, photons will be generated in the light-emitting diode structure 314A. On the other hand, the electrostatic discharge protection structure 318B includes the third semiconductor layer 316, a second active layer 317 disposed on the partial third semiconductor layer 316, and the fourth semiconductor layer 318 disposed on the second active layer 317. In one embodiment of the invention, the second active layer 317 of the electrostatic discharge protection structure 318B could be omitted.

In one embodiment of the invention, during processes of fabricating light-emitting diode chips, the first semiconductor layer 312 and the third semiconductor layer 316 are fabricated from the same semiconductor layer, the second semiconductor layer 314 and the fourth semiconductor layer 318 are fabricated from the same semiconductor layer, and the first active layer 313 and the second active layer 317 are fabricated from the same active layer.

In one embodiment of the invention, the interface includes a connection region including all components which are surrounded by a first surface 382, a second surface 384, and an upper surface 386 of the substrate 310. The first surface 382 extends from the upper surface 386 of the substrate 310 to an upper surface of the second semiconductor layer 314. The second surface 384 extends from the upper surface 386 of the substrate 310 to an upper surface of the fourth semiconductor layer 318. Specifically, the connection region includes a first protective layer 320, a first wire 330, a second protective layer 340 and a second wire 350.

The first protective layer 320 is used to insulate the light-emitting diode structure 314A from the electrostatic discharge protection structure 318B. The first protective layer 320 could be, for instance, a passivation layer or an insulating layer. The first wire 330 covers the first protective layer 320, and extends onto both the first semiconductor layer 312 and the fourth semiconductor layer 318. Moreover, due to the continuity of the structure of the first wire 330, the first semiconductor layer 312 could be electrically connected to the fourth semiconductor layer 318. On the other hand, the second protective layer 340 is disposed on the first wire 330, and the second wire 350 is disposed on the second protective layer 340. The second wire 350 extends onto the second semiconductor layer 314 and the third semiconductor layer 316 and electrically connects the second semiconductor layer 314 with the third semiconductor layer 316. In other words, the light-emitting diode structure 314A electrically connects the electrostatic discharge protection structure 318B through the connection region.

As shown in FIG. 3, both the second semiconductor layer 314 and the fourth semiconductor layer 318 are next to the connection region. In comparison with the fourth semiconductor layer 318 which is distant from the connection region, the light-emitting diode chip 300 in FIG. 3 retains smaller uncovered top-view area of the third semiconductor layer 316, with other area overlaid with the fourth semiconductor layer 318. This design results in smaller top-view area of the electrostatic discharge protection structure 318B, leading to larger top-view area of the light-emitting diode structure 314A and further increasing the brightness of the light-emitting diode chip 300.

In one embodiment of the invention, the first wire 330 is connected with the fourth semiconductor layer 318 through a second barrier layer 360b and a second mirror layer 370b. However, the invention is not limited to the illustrative embodiment. The first wire 330 could be directly connected to the fourth semiconductor layer 318 by omitting the second barrier layer 360b and the second mirror layer 370b.

In one embodiment of the invention, the second wire 350 is connected with the second semiconductor layer 314 through a first barrier layer 360a and a first mirror layer 370a. However, the invention is not limited to the illustrative embodiment. The second wire 350 could be directly connected to the second semiconductor layer 314 by omitting the first barrier layer 360a and the first mirror layer 370a.

Figure 4B:
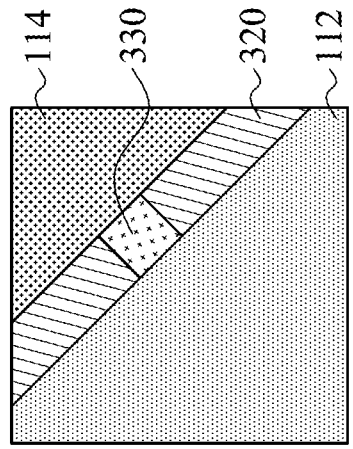
FIGS. 4A-4B are top-view diagrams of light-emitting diode chips according to one embodiment of this invention.
Figure 4A:
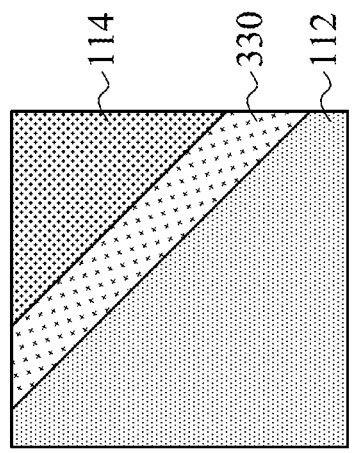

Please refer to the FIGS. 4A-4B. FIGS. 4A-4B are top-view diagrams of light-emitting diode chips according to one embodiment of this invention. In one embodiment of the invention, a light-emitting diode chip 410 includes a connection region between the light-emitting diode structure 112 and the electrostatic discharge protection structure 114 as shown in FIG. 4A. Only partial components in the connection region are shown here for clarity. As shown in FIG. 4A, the first protective layer 320 is entirely covered with the first wire 330. As a result, the first protective layer 320 could not be observed from the top view. Since the first wire 330 totally covers the first protective layer 320 and the first wire 330 is capable of reflecting light from active layer, the structural design of the light-emitting diode chip 410 could enhance the luminance of the light-emitting diode chip 410 and make the current flowing through the light-emitting diode structure 112 and the electrostatic discharge protection structure 114 more homogeneous.

In another embodiment of the invention, a light-emitting diode chip 420 includes a connection region between the light-emitting diode structure 112 and the electrostatic discharge protection structure 114 as shown in FIG. 4B. Only partial components in the connection region are shown here for clarity. As shown in FIG. 4B, the first wire 330 partially covers the electrostatic discharge protection structure 320 in the connection region. Therefore, part of the first protective layer 320 is exposed from the top view. Since the first protective layer 320 is partially covered with the first wire 330, it would decrease the possibility of occurring leakage current in the connection region. According to the embodiments illustrated by FIGS. 4A-4B, the degree of covering the first protective 320 with the first wire 330 is adjustable to satisfy design requirements of different light-emitting diode chips.

In summary, the invention provides the light-emitting diode chips including the light-emitting diode structure and the electrostatic discharge protection structure. Since the interface between the two structures is a straight line from the top view, the luminance, yield and electrical performance of the light-emitting diode chip are improved. Also, the possibility of occurring leakage current is reduced and thus the high-quality light-emitting diode chip is obtained.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light-emitting diode chip, comprising:
   a light-emitting diode structure; and
   an electrostatic discharge protection structure in a corner of the light-emitting diode chip and connecting with the light-emitting diode structure in anti-parallel,
   wherein an interface between the light-emitting diode structure and the electrostatic discharge protection structure is a straight line from a top view;
   wherein the light-emitting diode structure comprises:
      a first semiconductor layer having a first type doping;
      a first, active layer disposed on the partial first semiconductor layer; and
      a second semiconductor layer disposed on the first active layer, having a second type doping different from the first type doping, and being next to the interface;
   wherein the electrostatic discharge protection structure comprises:
      a third semiconductor layer having the first type doping;
      a second active layer disposed on the partial third semiconductor layer; and
      a fourth semiconductor layer disposed on the second active layer, having the second type doping, and being next to the interface; and
   wherein the interface comprises a connection region and the connection region comprises:
      a first protective layer insulation the light-emitting diode structure from the electrostatic discharge protection structure;
      a first wire covering the first protective layer. extending onto the first semiconductor layer and the fourth semiconductor layer, and electrically connecting the first semiconductor layer with the fourth semiconductor layer;
      a second protective layer disposed on the first wire; and
      a second wire disposed on the second protective layer, extending onto the second semiconductor layer and the third semiconductor layer, and electrically connecting the second semiconductor layer with the third semiconductor layer.

2. The light-emitting diode chip of claim 1, wherein a top-view outline of the electrostatic discharge protection structure is triangular.

3. The light-emitting diode chip of claim 1, wherein a top-view area of the electrostatic discharge protection structure is 0.5-30% of a top-view area of the light-emitting diode structure.

4. The light-emitting diode chip of claim 1, wherein the first type doping is n-type doping and the second type doping is p-type doping.

5. The light-emitting diode chip of claim 1, wherein the first wire partially covers the first protective layer.

6. The light-emitting diode chip of claim 1, further comprising:
   a first barrier layer between the second wire and the second semiconductor layer; and
   a second barrier layer between the second wire and the fourth semiconductor layer.

7. The light-emitting diode chip of claim 1, wherein the electrostatic discharge protection structure comprises a Zener diode or a Schottky diode.

* * * * *